United States Patent [19]
Pothast et al.

[11] Patent Number: 5,525,930
[45] Date of Patent: Jun. 11, 1996

[54] FREQUENCY COMPENSATION CIRCUIT FOR STABILIZING A DIFFERENTIAL AMPLIFIER WITH CROSS-COUPLED TRANSISTORS

[75] Inventors: Hendrik J. Pothast; Johannes O. Voorman, both of Eindhoven, Netherlands

[73] Assignee: U.S. Philips Corporation, New York, N.Y.

[21] Appl. No.: 318,410

[22] Filed: Oct. 5, 1994

[30] Foreign Application Priority Data

Oct. 11, 1993 [BE] Belgium ............... 09301066

[51] Int. Cl.⁶ ............... H03F 3/45; H03F 1/14
[52] U.S. Cl. ............... 330/252; 330/260; 330/292
[58] Field of Search ............... 330/252, 253, 330/260, 261, 292

[56] References Cited

U.S. PATENT DOCUMENTS 4,476,440  10/1984  Bennett, Jr. ............... 330/260

FOREIGN PATENT DOCUMENTS 8602892  6/1988  Netherlands ............... 330/252

*Primary Examiner*—Steven Mottola
*Attorney, Agent, or Firm*—Laurie E. Gathman

[57] ABSTRACT

A differential amplifier comprises a Darlington differential pair ($T_1/T_3$, $T_2/T_4$) and a cross-coupled transistor pair ($T_5$, $T_6$) to increase the transconductance of the Darlington differential pair ($T_1/T_3$, $T_2/T_4$). The negative input impedance of the differential amplifier as a result of the presence of the cross-coupled differential pair ($T_5$, $T_6$) is compensated for at high frequencies and the gain of the differential amplifier is reduced by a compensation circuit with a capacitor (30) between the control electrodes of the transistors of the cross-coupled differential pair ($T_5$, $T_6$) and with resistors (26, 28) in series with the control electrodes of the transistors of the cross-coupled differential pair ($T_5$, $T_6$).

5 Claims, 4 Drawing Sheets

FREQUENCY COMPENSATION CIRCUIT FOR STABILIZING A DIFFERENTIAL AMPLIFIER WITH CROSS-COUPLED TRANSISTORS

BACKGROUND OF THE INVENTION

The invention relates to a differential amplifier for amplifying an input signal to an output signal, comprising:

a first input terminal and a second input terminal for receiving the input signal, a first output terminal and a second output terminal for supplying the output signal, a first transistor and a second transistor, each having a first main electrode, a second main electrode and a control electrode, the control electrode of the first transistor being connected to the first input terminal and the control electrode of the second transistor being connected to the second input terminal;

a third transistor and a fourth transistor, each having a first main electrode, a second main electrode and a control electrode, the control electrode of the third transistor being connected to the first main electrode of the first transistor and the control electrode of the fourth transistor being connected to the first main electrode of the second transistor; the first main electrode of the third transistor and the first main electrode of the fourth transistor being connected to a first node to receive a bias current, and the second main electrode of the third transistor being coupled to the first output terminal and the second main electrode of the fourth transistor being coupled to the second output terminal, a fifth transistor and a sixth transistor, each having a first main electrode, a second main electrode and a control electrode, the control electrode of the fifth transistor being connected to the first main electrode of the first transistor and the control electrode of the sixth transistor being connected to the first main electrode of the second transistor; the first main electrode of the fifth transistor and the first main electrode of the sixth transistor being connected to a second node to receive a bias current; the second main electrode of the fifth transistor being connected to the first main electrode of the second transistor and the second main electrode of the sixth transistor being connected to the first main electrode of the first transistor.

Such a differential amplifier is known from Netherlands Patent Application no. 8602892, published on Jun. 1, 1988. Differential amplifiers of this type are also referred to as transconductors and are used inter alia in continuous-time balanced integrator filters for various purposes, such as video filters, equalizers etc. This requires differential amplifiers having a large gain-bandwidth product. Preferably, single-stage differential amplifiers are used in order to obtain a large bandwidth in conjunction with a low supply current. FIG. 1 shows the differential amplifier in accordance with the Netherlands Patent Application, which amplifier has a high gain and a large bandwidth owing to the cross-coupled fifth transistor $T_5$ and sixth transistor $T_6$. The cross-coupled transistors $T_5$ and $T_6$ provide positive feedback to reduce the conversion resistance of the first transistor $T_1$ and the second transistor $T_2$, as a result of which a large transconductance is obtained. However, a side-effect of the cross-coupled transistors is that the input impedance of the differential amplifier becomes negative. At low frequencies this effect is negligible but at high frequencies the filter circuit may become unstable as a result of additional phase shifts in the differential amplifier. A suitable compensation is required in order to suppress such instabilities. A conventional compensation method is illustrated in FIG. 2, which shows only a part of the differential amplifier. An RC series network having a positive impedance is arranged across the input terminals to neutralize the negative impedance of the differential amplifier at high frequencies. Although this known method is effective it reduces the high frequency gain and, consequently, the gain-bandwidth product.

SUMMARY OF THE INVENTION

It is an object of the invention to provide a compensation method so as to obtain a larger gain-bandwidth product.

According to the invention a differential amplifier of the type defined in the opening paragraph is therefore characterized in that the differential amplifier further comprises:

a first resistor connected between the control electrode of the fifth transistor and the first main electrode of the first transistor, a second resistor connected between the control electrode of the sixth transistor and the first main electrode of the second transistor, and a capacitor connected between the control electrode of the fifth transistor and the control electrode of the sixth transistor.

The compensation circuit in accordance with the invention comprises the first and the second resistor and the capacitor, embedded in the topology of the cross-coupled differential amplifier. At low frequencies the compensation circuit does not affect the operation of the differential amplifier owing to the high impedance of the capacitor. The impedance of the capacitor decreases at increasing frequencies. The compensation circuit then increasingly reduces the effect of the cross-coupled transistors and eventually replaces these transistors effectively by two resistors arranged in series. The input impedance of the cross-coupled differential amplifier then becomes positive. The compensation method in accordance with the invention only affects the operation of the cross-coupled transistors. The output transistors, i.e. the third transistor $T_3$ and the fourth transistor $T_4$, continue to provide the gain at high frequencies, in contradistinction to the known solution illustrated in FIG. 2, where at high frequencies the compensation circuit reduces the gain of the entire differential amplifier.

A further advantage of the compensation circuit in accordance with the invention in comparison with the known compensation method illustrated in FIG. 2 is that it requires a comparatively small chip area. A comparatively small time constant is attainable as a result of the gain from the first and the second input terminals of the differential amplifier to the control electrodes of the cross-coupled fifth and sixth transistors.

BRIEF DESCRIPTION OF THE DRAWING

These and other features of the invention will be described and elucidated with reference to the accompanying drawings, in which.

In the figures parts or elements having the same function or purpose bear the same references.

DETAILED DESCRIPTION OF THE PREFERRED EMBODIMENTS

Figure 3:
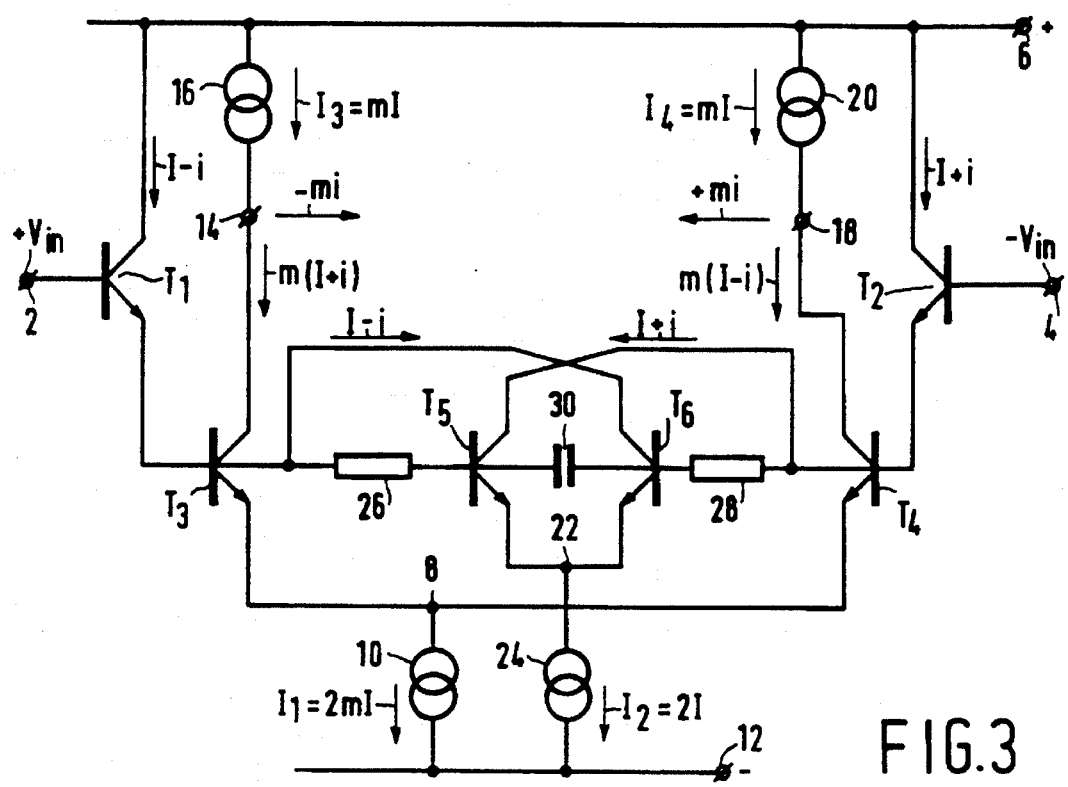
FIG. 3 shows a differential amplifier according to the invention with compensation in the cross-coupled transistors.

FIG. 3 shows a first embodiment of a compensated differential amplifier with bipolar transistors and with cross-coupled transistors in accordance with the invention. The differential amplifier comprises a first transistor $T_1$ having its control electrode or base connected to a first input terminal 2 and a second transistor $T_2$ having its base connected to a second input terminal 4. The second main electrode or collector of the first transistor $T_1$ and that of the second transistor $T_2$ are connected to a positive supply terminal 6. The differential amplifier further comprises a third transistor $T_3$ having its base connected to the first main electrode or emitter of the first transistor $T_1$, and a fourth transistor $T_4$ having its base connected to the emitter of the second transistor $T_2$. The emitters of the third transistor $T_3$ and the fourth transistor $T_4$ are connected to a first node 8, which is coupled to a negative supply terminal via a first current source 10. The first current source 10 supplies a bias current $I_1=2$ mI to the first node 8. The collector of the third transistor $T_3$ is connected to a first output terminal 14, which is coupled to the positive supply terminal 6 via a third current source 16. The collector of the fourth transistor $T_4$ is connected to a second output terminal 18, which is coupled to the positive supply terminal 6 via a fourth current source 20. The third current source 16 supplies a bias current $I_3=$mI and the fourth current source 20 also supplies a bias current $I_4=$mI. The differential amplifier further comprises a fifth transistor $T_5$ having its collector connected to the emitter of the second transistor $T_2$, and a sixth transistor $T_6$ having its collector connected to the emitter of the first transistor $T_1$. The emitters of the fifth transistor $T_5$ and the sixth transistor $T_6$ are connected to a second node 22, which is coupled to the negative supply terminal via a second current source 24. The second current source 24 supplies a bias current $I_2=2$I to the second node 22. The base of the fifth transistor $T_5$ is connected to the emitter of the first transistor $T_1$ via a first resistor 26. The base of the sixth transistor $T_6$ is connected to the emitter of the second transistor $T_2$ via a second resistor 28. A capacitor 30 is connected between the base of the fifth transistor $T_5$ and the base of the sixth transistor $T_6$.

The operation of the differential amplifier can be explained as follows. First of all, it is assumed that the first resistor 26 and the second resistor 28 have been short-circuited and that the capacitor 30 has been omitted. When a balanced input voltage $+V_{in}$ and $-V_{in}$ is applied to the input terminals 2 and 4, respectively, a current I−i will flow through the first transistor $T_1$ and a current I+i through the second transistor $T_2$, i being a signal current caused by the input voltage. The current I−i through the first transistor $T_1$ also flows through the sixth transistor $T_6$, and the current I+i through the second transistor $T_2$ also flows through the fifth transistor $T_5$. The magnitude of the signal current i is determined by the sum of the base-emitter resistances of the first transistor $T_1$, the second transistor $T_2$, the fifth transistor $T_5$ and the sixth transistor $T_6$. Since the signal currents through the first transistor $T_1$ and the fifth transistor $T_5$ and through the second transistor $T_2$ and the sixth transistor $T_6$ are opposed the emitter resistance of the first transistor $T_1$ is substantially compensated for by that of the fifth transistor $T_5$ and the emitter resistance of the second transistor $T_2$ is substantially compensated for by that of the sixth transistor $T_6$. The positive feedback of the cross-coupled fifth transistor $T_5$ and the sixth transistor $T_6$ makes the transconductance of the circuit comprising the first transistor $T_1$, the second transistor $T_2$, the fifth transistor $T_5$ and the sixth transistor $T_6$ very large. The third transistor $T_3$, the fourth transistor $T_4$, the fifth transistor $T_5$ and the sixth transistor $T_6$ form a translinear loop. In the case of equal emitter areas it follows from the well-known exponential relationship between the collector current and the base-emitter voltage of a bipolar transistor that the currents through the third transistor $T_3$ and the fifth transistor $T_5$ and the currents through the fourth transistor $T_4$ and the sixth transistor $T_6$ bear the same ratio to one another as the current $I_1$ of the first current source 10 and the current $I_2$ of the second current source 24. Consequently, the current flowing through the third transistor $T_3$ is m(I+i) and that through the fourth transistor $T_4$ is re(I−i). The d.c. component mI of the current through the third transistor $T_3$ is furnished by the third current source 16, so that a signal current −mi is available at the first output terminal 14. The d.c. component mI of the current through the fourth transistor $T_4$ is supplied by the fourth current source 20, so that a signal current +mi is available at the second output terminal 18.

The fifth transistor $T_5$ and the sixth transistor $T_6$ thus raise the transconductance of the differential pair comprising the first transistor $T_1$ and the second transistor $T_2$, while the differential pair comprising the third transistor $T_3$ and the fourth transistor $T_4$ provide additional current gain. The input impedance between the first input terminal 2 and the second input terminal 4 is negative. For a detailed analysis of the operation of the differential amplifier and for a calculation of the input impedance reference is made to U.S. Pat. No. 4,476,440. At low frequencies the effect of the negative input impedance is negligible but at high frequencies a filter circuit comprising one or more differential amplifiers may become unstable as a result of additional phase shifts in the differential amplifier. A suitable compensation is necessary in order to suppress such instabilities. The compensation circuit comprises the first resistor 26, the second resistor 28 and the capacitor 30, which are embedded in the topology of the cross-coupled fifth transistor $T_5$ and the sixth transistor $T_6$. At low frequencies the compensation circuit does not affect the operation of the cross-coupled transistors owing to the high impedance of the capacitor 30. The impedance of the capacitor 30 decreases at increasing frequencies. The compensation circuit then increasingly reduces the effect of the cross-coupled transistors and eventually replaces these transistors effectively by the first resistor 26 and the second resistor 28 arranged in series. As a result of this, the input importance of the cross-coupled differential amplifier becomes positive. The compensation method in accordance with the invention affects virtually only the operation of the cross-coupled transistors. The output transistors, i.e. the third transistor $T_3$ and the fourth transistor $T_4$, continue to provide the gain at high frequencies, in contradistinction to the known solution illustrated in FIG. 2, where the compensation circuit reduces the gain of the entire differential amplifier at high frequencies.

Figure 1:
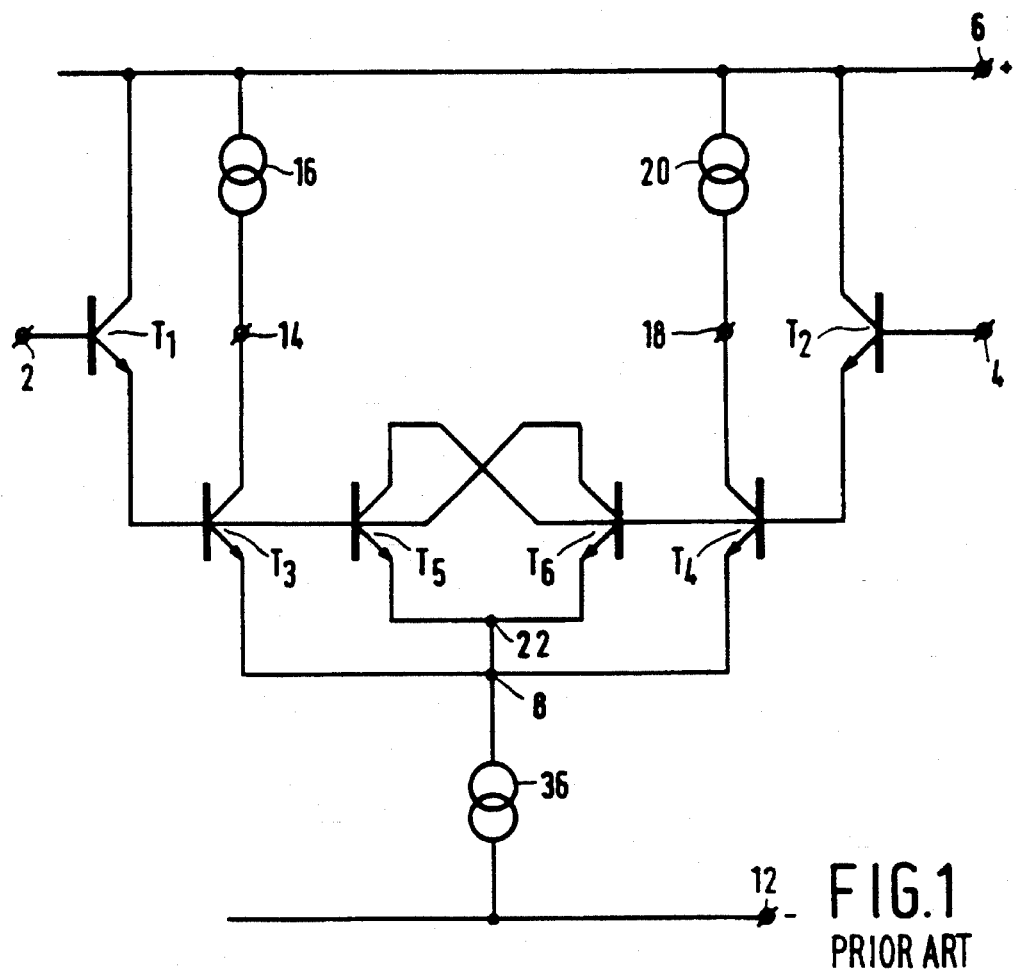
FIG. 1 shows a known differential amplifier with cross-coupled transistors.
Figure 2:
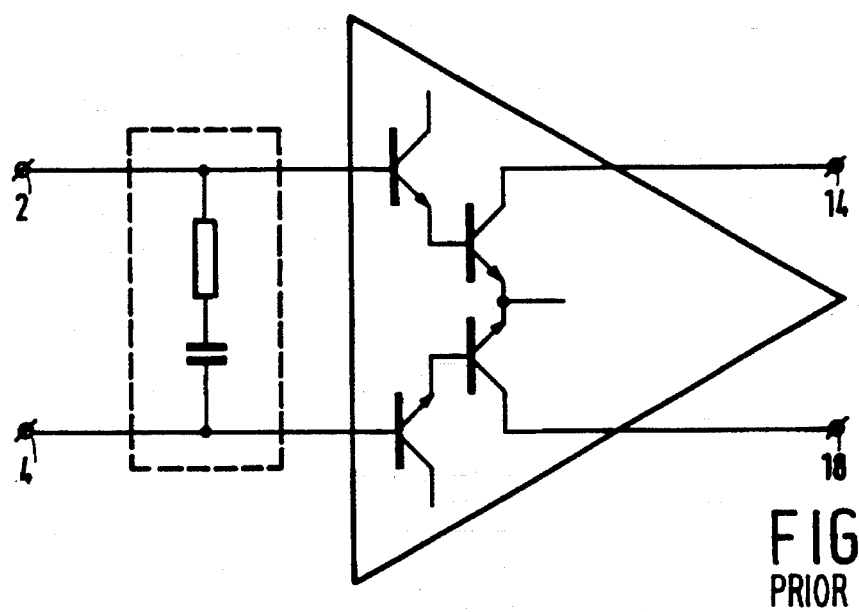
FIG. 2 illustrates a known compensation technique for stabilizing the differential amplifier shown in FIG. 1.

A further advantage of the compensation circuit in accordance with the invention in comparison with the known compensation method illustrated in FIG. 2 is that it requires a comparatively small chip area. A comparatively small time constant is attainable as a result of the signal gain from the first input terminal 2 and the second input terminal 4 to the bases of the cross-coupled fifth transistor $T_5$ and sixth transistor $T_6$.

Figure 4:
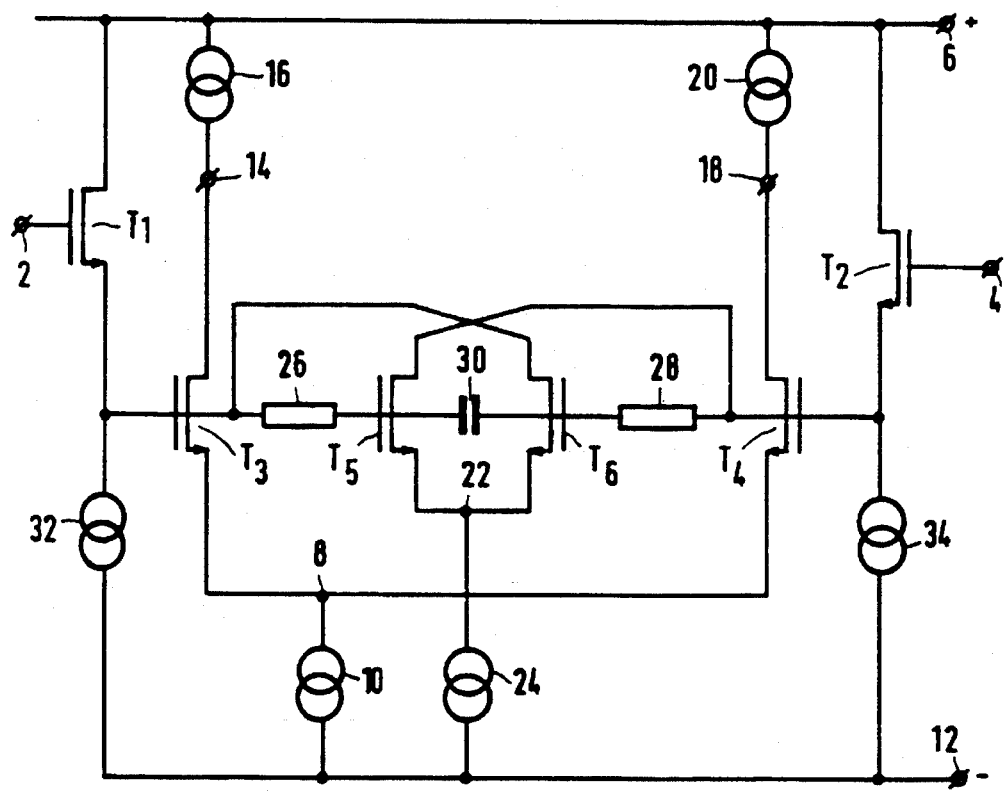
FIG. 4 shows a first alternative embodiment of a differential amplifier in accordance with the invention.

FIG. 4 shows the same differential amplifier as FIG. 3 but equipped with unipolar transistors, in which case the source, drain and gate perform the functions of the first main electrode, the second main electrode and the control electrode, respectively. In the present case insulated-gate MOS field-effect transistors are used but it is also possible to employ junction field-effect transistors (JFETs). The optional current source 32 between the source of the first transistor $T_1$ and the negative supply terminal 12 and the optional current source 34 between the source of the second transistor $T_2$ and the negative supply terminal preclude latch-up in the case of large input signals.

Figure 5:
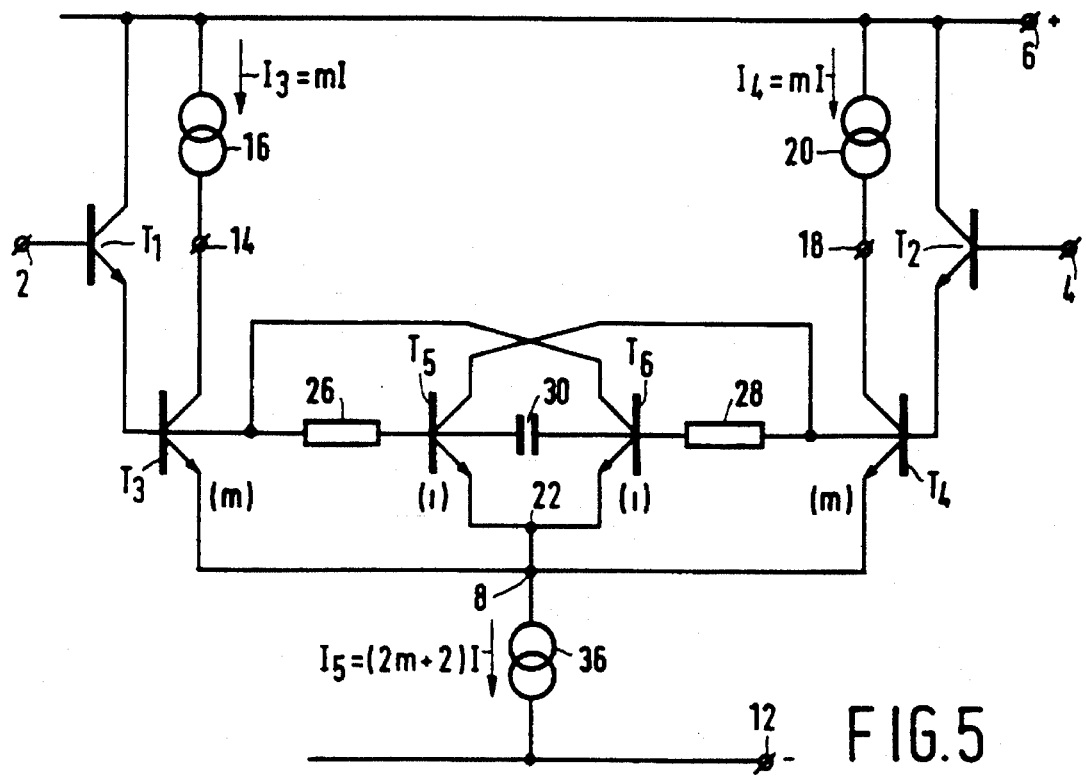
FIG. 5 shows a second alternative embodiment of a differential amplifier in accordance with the invention.

FIG. 5 shows an alternative configuration of the differential amplifier. The differential amplifier shown in FIG. 3 has two separate current sources 10 and 24, whose currents $I_1$ and $I_2$ are in a ratio of m:1 in order to obtain a current gain m in the case of equal emitter areas of the third transistor $T_3$, the fourth transistor $T_4$, the fifth transistor $T_5$ and the sixth transistor $T_6$. In the differential amplifier shown in FIG. 5 said four transistors are operated by a common current source 36, which is connected both to the first node 8 and the second node 22 and which supplies a bias current $I_5=(2m+2)I$. However, the emitter area of the third transistor $T_3$ and of the fourth transistor $T_4$ is now m times as large as the emitter area of the fifth transistor $T_5$ and the sixth transistor $T_6$. As a result of this, the currents through the third transistor $T_3$ and the fifth transistor $T_5$ and the currents through the fourth transistor $T_4$ and the sixth transistor $T_6$ again bear a ratio of m:1 to one another. Further, the operation is identical to that of the differential amplifier shown in FIG. 3. In the case of unipolar transistors the so-called W/L ratio of the relevant transistors instead of the emitter area should be scaled in similar proportions.

In order to obtain a comparatively high gain factor m the differential amplifier shown in FIG. 3 requires comparatively large emitter areas for the third transistor $T_3$ and the fourth transistor $T_4$. This problem can be avoided by means of the differential amplifier shown in FIG. 6, in which the third transistor $T_3$, the fourth transistor $T_4$, the fifth transistor $T_5$ and the sixth transistor $T_6$ have equal emitter areas. The first node 8 is now connected directly to the common current source 36 and the second node 22 is connected to this source via a third resistor 38. In order to achieve that the current through the third transistor $T_3$ and the fourth transistor $T_4$ are m times as large as the currents through the fifth transistor $T_5$ and the sixth transistor $T_6$ the difference between the base-emitter voltages of the third transistor $T_3$ and the fifth transistor $T_5$ and between the base-emitter voltages of the fourth transistor $T_4$ and the sixth transistor $T_6$ should be equal to $kT/q*\ln(m)$. For a current 2I through the third resistor this means that the resistance R of the third resistor 38 should be equal to $kT/(2qI)*\ln(m)$. The current density in the third transistor $T_3$ and in the fourth transistor $T_4$ is higher than in the differential amplifier shown in FIG. 5 and provides an improved high-frequency performance of the differential amplifier.

Figure 7:
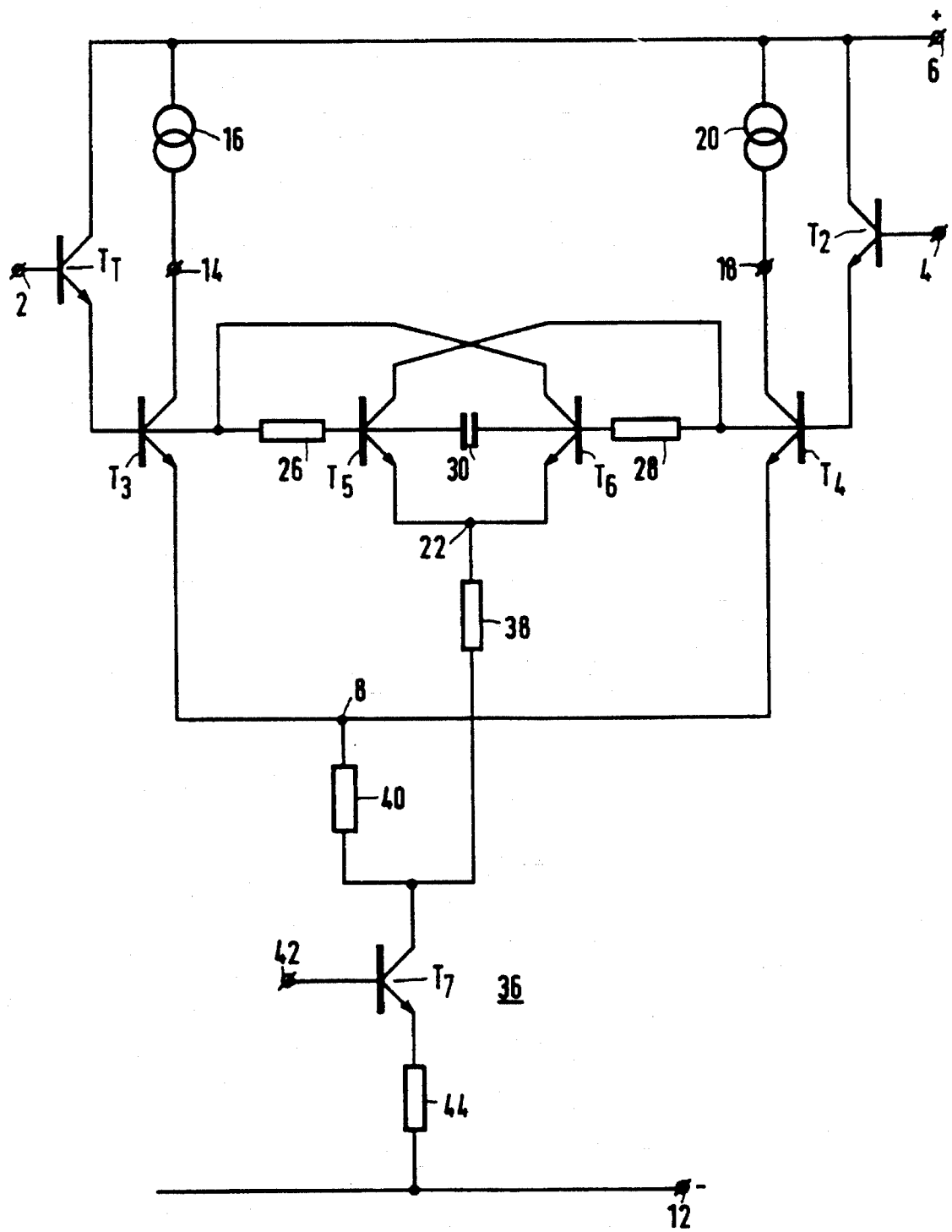
FIG. 7 shows a fourth alternative embodiment of a differential amplifier in accordance with the invention.

FIG. 7 shows an alternative configuration in which not only the second node is connected to the common current source 36 via the third resistor 38 but the first node 8 is also connected to said source via a fourth resistor 40. The common current source 36 is now constructed as a seventh transistor $T_7$ whose base is connected to a reference terminal 42, whose emitter is connected to the negative supply terminal 12 via resistor 44 and whose collector is connected to the third resistor 38 and the fourth resistor 40. The ratio between the currents through the third transistor $T_3$ and the fifth transistor $T_5$ and, consequently, between the currents through the fourth transistor $T_4$ and the sixth transistor $T_6$ is determined mainly by the ratio between the resistance values of the third resistor 38 and the fourth resistor 40. Since this resistance ratio can be selected freely it is also possible to realize almost any current gain factor m by means of the differential amplifier shown in FIG. 7.

Figure 6:
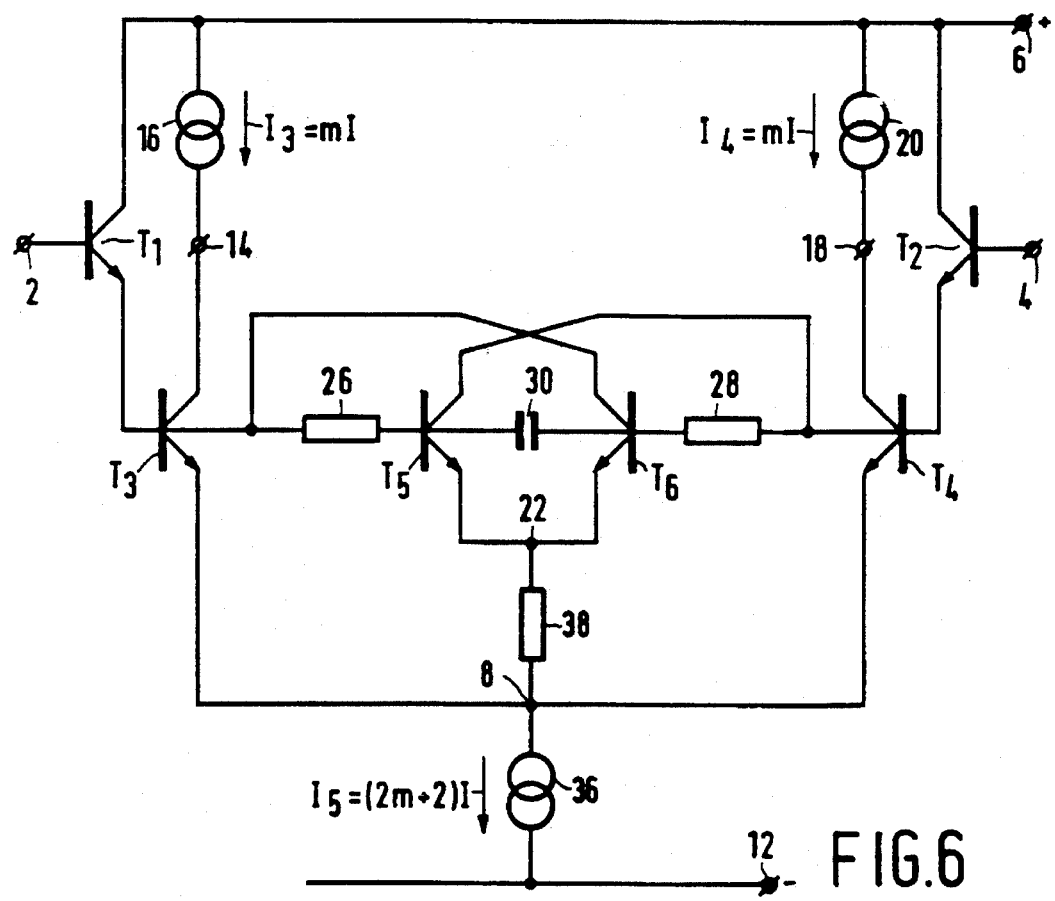
FIG. 6 shows a third alternative embodiment of a differential amplifier in accordance with the invention.

In the same way as the differential amplifier shown in FIG. 3 the differential amplifiers shown in FIGS. 5, 6 and 7 may also be equipped with unipolar MOS transistors or junction field-effect transistors (JFETs). Moreover, the bipolar and unipolar transistors shown herein may be replaced by transistors of opposite conductivity types, in which case the polarity of the power supply should be reversed.

We claim:

1. A differential amplifier for amplifying an input signal to an output signal, comprising:

a first input terminal and a second input terminal for receiving the input signal, a first output terminal and a second output terminal for supplying the output signal, a first transistor and a second transistor, each having a first main electrode, a second main electrode and a control electrode, the control electrode of the first transistor being coupled to the first input terminal and the control electrode of the second transistor being coupled to the second input terminal;

a third transistor and a fourth transistor, each having a first main electrode, a second main electrode and a control electrode, the control electrode of the third transistor being coupled to the first main electrode of the first transistor and the control electrode of the fourth transistor being coupled to the first main electrode of the second transistor; the first main electrode of the third transistor and the first main electrode of the fourth transistor being coupled to a first node to receive a bias current, and the second main electrode of the third transistor being coupled to the first output terminal and the second main electrode of the fourth transistor being coupled to the second output terminal, a fifth transistor and a sixth transistor, each having a first main electrode, a second main electrode and a control electrode, the control electrode of the fifth transistor being coupled to the first main electrode of the first transistor and the control electrode of the sixth transistor being coupled to the first main electrode of the second transistor; the first main electrode of the fifth transistor and the first main electrode of the sixth transistor being coupled to a second node to receive a bias current; the second main electrode of the fifth transistor being coupled to the first main electrode of the second transistor and the second main electrode of the sixth transistor being coupled to the first main electrode of the first transistor, characterized in that the differential amplifier further comprises:

a first resistor coupled between the control electrode of the fifth transistor and the first main electrode of the first transistor, a second resistor coupled between the control electrode of the sixth transistor and the first main electrode of the second transistor, and a capacitor coupled between the control electrode of the fifth transistor and the control electrode of the sixth transistor.

2. A differential amplifier as claimed in claim 1, characterized in that the first node is coupled to a first current source and the second node is coupled to a second current source.

3. A differential amplifier as claimed in claim 1, characterized in that the first node and the second node are coupled to a common current source, and the dimensions of the third transistor and the fourth transistor are larger than or equal to the dimensions of the fifth transistor and the sixth transistor.

4. A differential amplifier as claimed in claim 1, characterized in that the first node is coupled to a current source and the second node is coupled to the current source via a third resistor.

5. A differential amplifier as claimed in claim 4, characterized in that the first node is coupled to the current source via a fourth resistor.

* * * * *